United States Patent
Ahmed et al.

(10) Patent No.: US 7,525,319 B1
(45) Date of Patent: Apr. 28, 2009

(54) METHOD AND APPARATUS TO ELECTRICALLY QUALIFY HIGH SPEED PCB CONNECTORS

(75) Inventors: Rubina Firdaus Ahmed, Cary, NC (US); Moises Cases, Austin, TX (US); Bradley Donald Herrman, Cary, NC (US); Kent Barclay Howieson, Austin, TX (US); Bhyrav Murthy Mutnury, Austin, TX (US); Pravin Patel, Cary, NC (US); Peter Robert Seidel, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/200,208

(22) Filed: Aug. 28, 2008

(51) Int. Cl.
  *G01R 31/04* (2006.01)
  *G01R 31/02* (2006.01)
  *G01R 31/28* (2006.01)

(52) U.S. Cl. ............... 324/538; 324/754; 714/734

(58) Field of Classification Search .............. None
See application file for complete search history.

(56) References Cited

U.S. PATENT DOCUMENTS

| | | | |
|---|---|---|---|
| 4,168,796 A | | 9/1979 | Fulks et al. |
| 5,268,644 A | * | 12/1993 | Klassen et al. ............ 324/503 |
| 5,428,506 A | * | 6/1995 | Brown et al. ............ 361/794 |
| 6,281,699 B1 | | 8/2001 | Bishop |
| 6,294,908 B1 | | 9/2001 | Belmore et al. |
| 6,822,435 B2 | | 11/2004 | Nomura |
| 6,906,544 B1 | | 6/2005 | Shanker et al. |
| 6,960,917 B2 | | 11/2005 | Parker et al. |
| 7,353,599 B2 | | 4/2008 | Lau et al. |
| 7,355,413 B2 | | 4/2008 | Motohashi |
| 2004/0169520 A1 | | 9/2004 | Larikova et al. |
| 2005/0077907 A1 | * | 4/2005 | Parker et al. ............ 324/538 |

FOREIGN PATENT DOCUMENTS

JP    2002-071756    3/2002

* cited by examiner

*Primary Examiner*—Diego Gutierrez
*Assistant Examiner*—Jeff Natalini
(74) *Attorney, Agent, or Firm*—McGinn IP Law Group, PLLC

(57) ABSTRACT

A method of electrically qualifying high speed printed circuit board (PCB) connectors includes mounting a PCB connector on a test card, sending bit patterns through a first portion of the test card, evaluating a waveform on a sense signal on a second portion of the test card for the bit patterns launched on said first portion of the test card to measure common mode noise, and comparing the measured common mode noise of the second portion of the test card to a golden standard performed on a pre-qualified connector. The first portion of the test card comprises connectors to inject bit patterns. The second portion of the test card includes a split plane which induces common mode noise on a sense signal, the sense signal, and a termination pack. If the measured common mode noise on the PCB connector is worse than the golden standard, then the PCB connector is disqualified. If the measured common mode noise on the PCB connector is as good as or better than the golden standard, then the PCB connector is qualified. A first section of the PCB connector connects to the first portion of the test card and a second section of the PCB connector connects to the second portion of the test card. Transmission lines in the test card and the sense line are tightly coupled by shortening a distance between the sense line and the transmission lines.

1 Claim, 2 Drawing Sheets

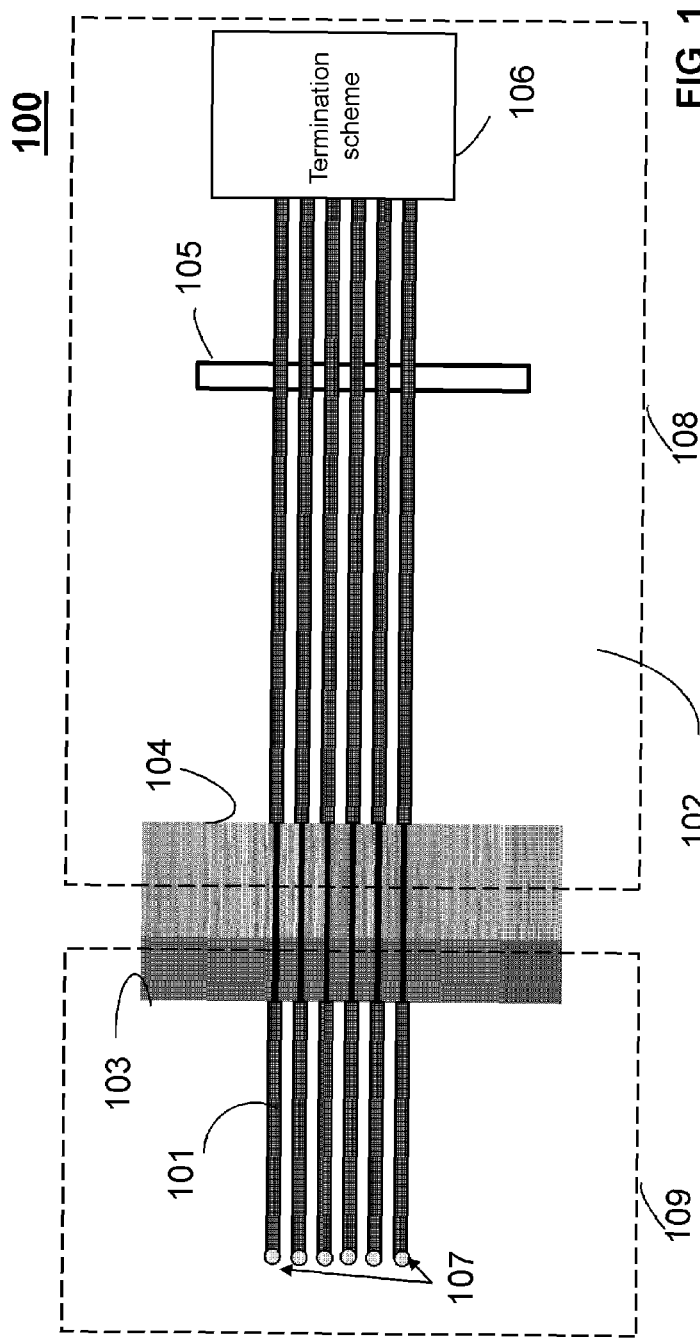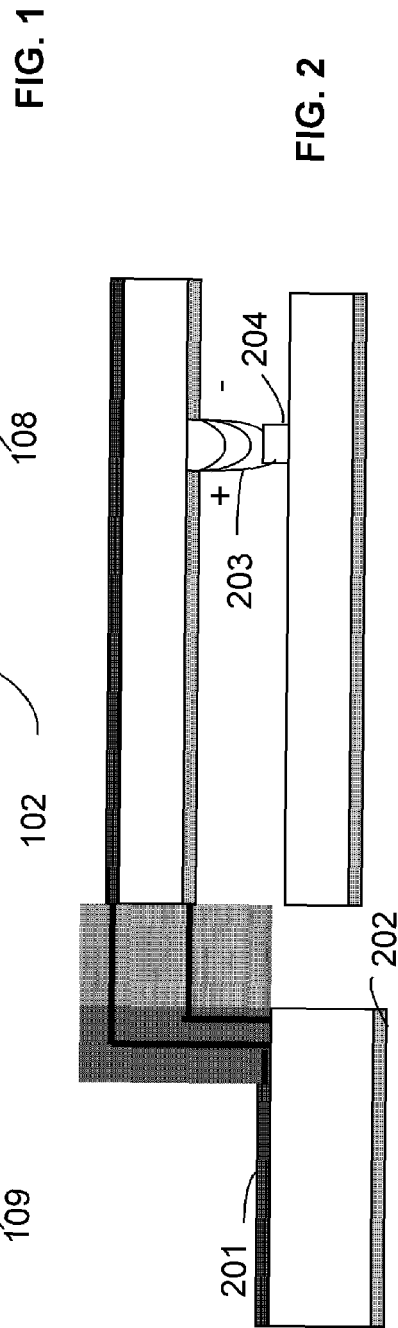

METHOD AND APPARATUS TO ELECTRICALLY QUALIFY HIGH SPEED PCB CONNECTORS

BACKGROUND OF THE INVENTION

1. Field of the Invention

The present invention generally relates to a method and apparatus to electrically qualify high speed printed circuit board (PCB) connectors, and more specifically to a method and apparatus for evaluating quality of a PCB connector by testing parasitic effects through its common mode noise generation.

2. Description of the Related Art

With the ever increasing frequencies of operation, high speed PCB designs are becoming more and more challenging. Signal integrity issues like conductor loss, material loss, reflections, and crosstalk are becoming ever more important. PCB connectors are one such source causing signal integrity problems in these high speed systems. Connectors with proper pin assignment can minimize reflections, crosstalk and other parasitic effects, but they cannot totally remove these effects. That is the reason that high speed connectors that minimize signal integrity effects are very expensive.

One common problem that PCB electrical designers encounter regularly on their products is how to qualify a connector (also second source connector) for a particular design. It is especially tough to qualify when the design(s) is close to margin. Currently, equipment like a time-domain reflectometer (TDR) and a vector network analyzer (VNA) is used to extract loss and crosstalk profiles of connectors. Although these techniques seem adequate, these approaches depend on factors like good calibration, expensive instruments, and expensive cables. Any measurement without proper calibration or good cables would result in inferior results. Also, the learning curve involved with these techniques is very steep.

SUMMARY OF THE INVENTION

In view of the foregoing and other exemplary problems, drawbacks, and disadvantages of the conventional methods and structures, an exemplary feature of the present invention is to provide a method and system to electrically qualify high speed printed circuit board connectors.

An exemplary embodiment of the present invention includes a method for evaluating an electrical connector that would make the job of PCB electrical designers more efficient and easy. According to the present invention, the parasitic effects of a connector are tested through its common mode noise generation by using test cards. The common mode generated from the connector is then sensed using a scope to determine the quality of the connector.

BRIEF DESCRIPTION OF THE DRAWINGS

The foregoing and other exemplary purposes, aspects and advantages will be better understood from the following detailed description of exemplary embodiments of the invention with reference to the drawings, in which:

FIG. 1 illustrates a top view of a system to electrically qualify high speed PCB connectors according to an exemplary aspect of the present invention;

FIG. 2 illustrates a side view of a system to electrically qualify high speed PCB connectors according to an exemplary aspect of the present invention.

DETAILED DESCRIPTION OF EXEMPLARY EMBODIMENTS OF THE INVENTION

Figure 3:
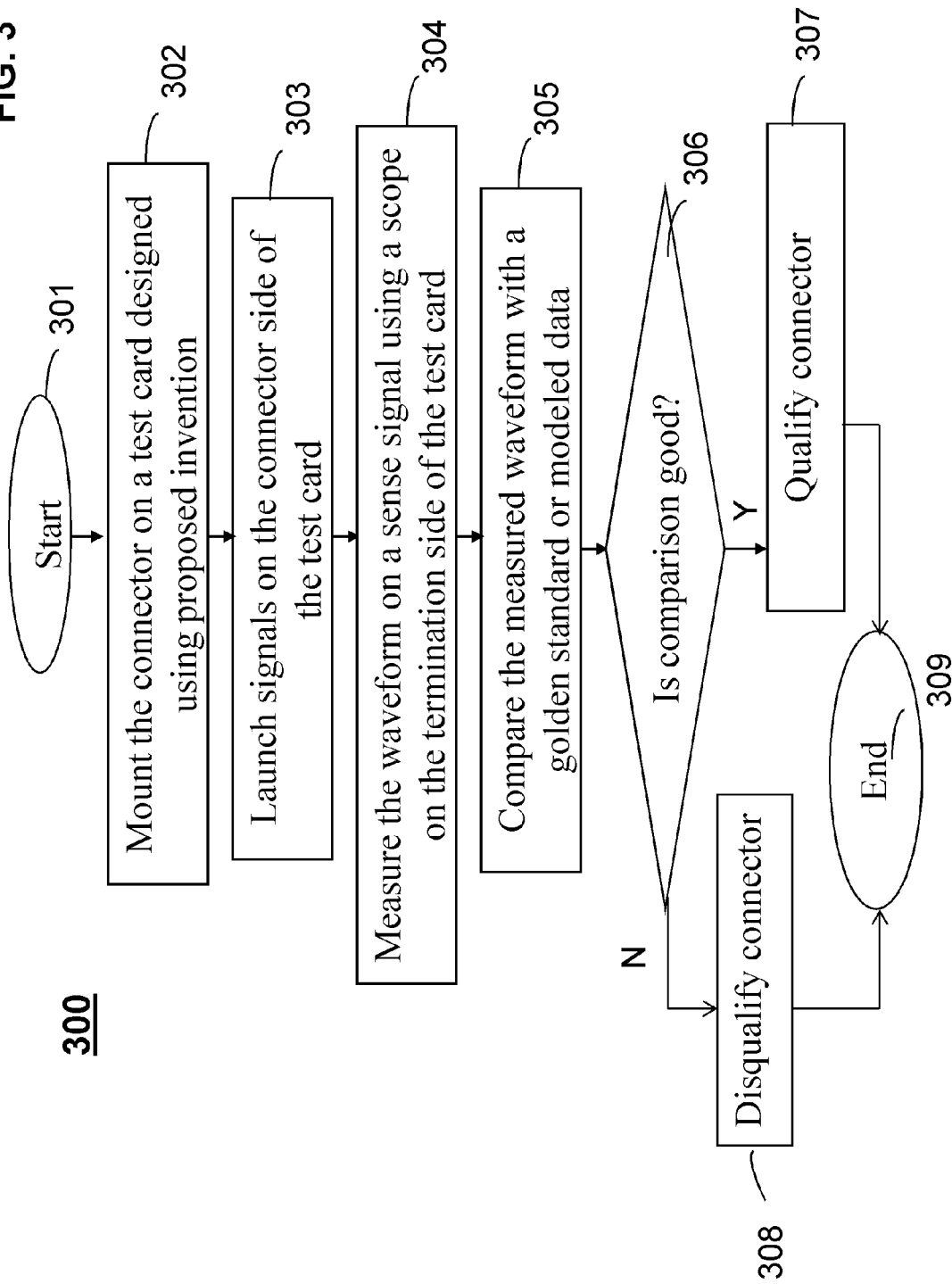
FIG. 3 illustrates a flow chart 300 for a method of electrically qualifying high speed PCB connectors according to an exemplary aspect of the present invention.

Referring now to the drawings, and more particularly to FIGS. 1-3, there are shown exemplary embodiments of the system and method according to the present invention.

FIG. 1 shows a top view of a system to electrically qualify high speed PCB connectors according to an exemplary aspect of the present invention. In this system, a connector under qualification is mounted on a test card that includes a first portion 109 and a second portion 108. The parasitic effects of the connector are tested through its common mode noise generation to determine the quality of the connector. Parasitic effects like crosstalk, coupling, and reflections manifest themselves as common mode noise in connectors.

The exemplary system 100 includes a connector, which includes a first section 103 and a second section 104, where variation in connector parts manifest as different amounts of common mode noise. The common mode component for a tightly coupled differential pair appears as return current in a ground layer and is a single end loop.

The system 100 also includes pads 107 to launch a bitstream, transmission lines 101, ground plane 102, and termination scheme 106. The common noise amount in this test structure is a function of the connector design. A mated connector is a source of differential mode to common mode conversion due to geometrical structure change and can vary from part to part.

Current in a true differential signal (i.e., no common mode component) is in the plus and minus traces of the pair and not in the ground plane. According to the present invention, differential routing is tightly coupled on the test card. Tight coupling is accomplished by setting the line-to-line space to be much less (e.g., <½) than the signal-line-to shield layer spacing. The traces on the test cards are designed to have minimum crosstalk and common mode noise due to the test card. The test card differential pairs are routed over a long PCB split 105.

FIG. 2 illustrates a side view of a system to electrically qualify high speed PCB connectors according to an exemplary aspect of the present invention. Transmission line 201, ground plane 202, coupling 203, and sense line 204 are shown in the figure.

The break in the return current path will result in common mode noise to get over the split 105. Since the split provides a path of high impedance, most of the current is returned through a trace below the split 105. Tight coupling between the transmission lines 201 and sense line 204 is accomplished by cutting the distance between the sense line 204 and transmission line 201 short or by making the shape of the split 105 wide. Sensing an amount of coupling on the sense line 204 will determine the amount of common mode noise generated and the quality of the connector.

FIGS. 1 and 2 show an embodiment with one transmission line layer, one ground layer and one sense line layer, but the invention can be extended to include multiple layers of transmission lines, multiple layers of ground and multiple layers of sense lines.

FIG. 3 depicts a flow chart 300 for a method of electrically qualifying high speed PCB connectors according to an exemplary aspect of the present invention. The method 300 starts in step 301 and continues to step 302, where a connector is mounted on a test card. A first portion of the test card has probe points, Sub-Miniature version A (SMA), or similar connectors to inject bit patterns. A second portion of the test card has a split plane (that induces common mode noise), a sense line, and a resistive termination pack. A first section of the PCB connector under qualification connects to the first portion of the test card and a second section of the PCB connector connects to the second portion of the test card.

In step 303, bit patterns are sent through the first portion of the card. The bit pattern can be pseudo random or any encoding based bit pattern, such as 8b10b or K28.5. In step 304, a waveform on the sense line on the second portion of the test card is evaluated by using a scope for the bit patterns launched on the first portion of the test card to measure common mode noise.

In step 305, the measured common mode noise is compared against a "golden standard" that is performed on a good (pre-qualified) connector. The golden standard can also be modeled and simulated data.

In step 306, it is determined if the measured common mode noise on the connector is better or worse than the golden standard. In an exemplary embodiment of the present invention, peak-peak noise swing is used as a metric to determine electrical quality of the connector.

In step 307, if the measured data on the connector under qualification is as good as or better than the golden standard, then the connector is qualified. In step 308, if the measured data on the connector under qualification is worse than the golden standard, then the connector is disqualified. After this qualification process, step 309 ends the evaluation.

It should be noted that other purposes, features, and aspects of the present invention will become apparent in the entire disclosure. Modifications may be done without departing from the gist and scope of the present invention as disclosed herein and claimed as appended herewith.

In addition, it should be noted that any combination of the disclosed and/or claimed elements, matters and/or items may fall under the modifications aforementioned.

What is claimed is:

1. A method of electrically qualifying high speed printed circuit board (PCB) connectors, said method comprising:

mounting a PCB connector on a test card,
    wherein a first portion of the test card comprises a plurality of pads to launch a bitstream,
    wherein a second portion of the test card comprises:
    a split plane which induces common mode noise on a sense line;
    the sense line; and
    a termination pack, and
    wherein transmission lines in the test card and the sense line are tightly coupled by shortening a distance between the sense line and the transmission lines;

sending bit patterns through said first portion of the test card;

evaluating a waveform on the sense line on said second portion of the test card, using a scope, for the bit patterns launched on said first portion of the test card to measure common mode noise;

comparing the measured common mode noise of said second portion of the test card to a golden standard, wherein a peak-peak noise swing is used as a metric to determine electrical quality of the PCB connector;

wherein, if the measured common mode noise on the PCB connector is worse than the golden standard, then the PCB connector is disqualified, wherein, if the measured common mode noise on the PCB connector is as good as or better than the golden standard, then the PCB connector is qualified, and wherein a first section of the PCB connector connects to said first portion of the test card and a second section of the PCB connector connects to said second portion of the test card.

\* \* \* \* \*